United States Patent [19]

Anderson

[11] 4,330,759
[45] May 18, 1982

[54] APPARATUS FOR GENERATING SYNCHRONIZED TIMING PULSES FROM BINARY DATA SIGNALS

[75] Inventor: Thomas W. Anderson, Warrenville, Ill.

[73] Assignee: Bell Telephone Laboratories, Incorporated, Murray Hill, N.J.

[21] Appl. No.: 127,477

[22] Filed: Mar. 5, 1980

[51] Int. Cl.³ .............................................. H03L 7/08
[52] U.S. Cl. ....................................... 331/14; 331/25; 331/173
[58] Field of Search ....................... 331/18, 25, 27, 14, 331/172, 173, 177 R, 177 V; 328/155; 329/50, 122, 124; 455/260, 265; 375/120

[56] References Cited

U.S. PATENT DOCUMENTS

| | | | |
|---|---|---|---|
| 3,376,517 | 4/1968 | Reynolds | 331/25 X |
| 3,500,226 | 3/1970 | Eisenberg | 331/25 X |
| 3,544,907 | 12/1970 | Bleickard | 328/63 |
| 3,714,589 | 1/1973 | Lewis | 328/155 |
| 3,805,180 | 4/1974 | Widmer | 331/25 X |

Primary Examiner—Siegfried H. Grimm
Attorney, Agent, or Firm—P. Visserman

[57] ABSTRACT

Timing pulses are generated from operative synchronous data pulses by means of a crystal oscillator under direct control of the output signal of a D flip-flop. The flip-flop is set or reset depending on the phase of the clock pulse relative to the leading edge of the data pulse.

5 Claims, 3 Drawing Figures

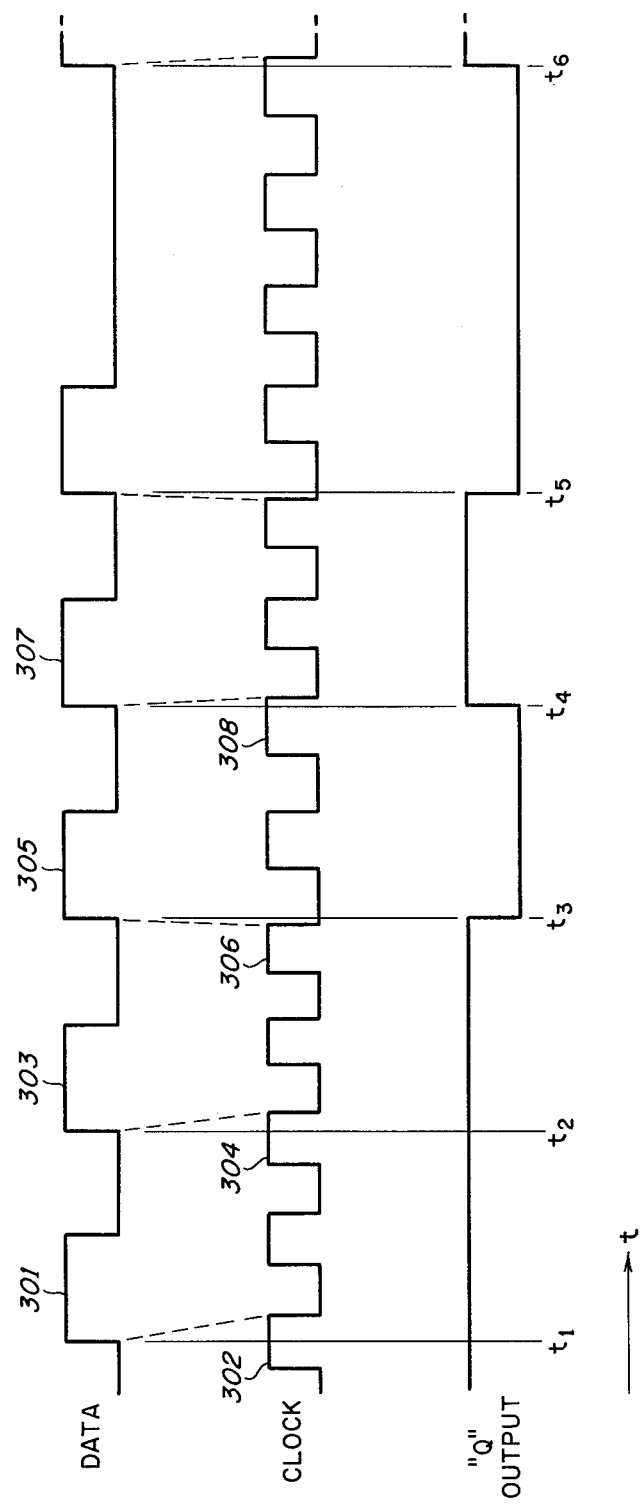

APPARATUS FOR GENERATING SYNCHRONIZED TIMING PULSES FROM BINARY DATA SIGNALS

TECHNICAL FIELD

The invention relates to phase synchronization circuits, and more particularly, to phase-locked loop circuits for generating clock signals in synchronism with synchronously occurring aperiodic incoming data signals.

BACKGROUND OF THE INVENTION

In apparatus for receiving incoming synchronous data signals, it is advantageous to generate periodic clock pulses having a fixed relationship to the pulses of the incoming data. To achieve a desired relationship, the clock pulses may be derived from the data by utilization of a phase-locked loop circuit. Traditionally, a phase-locked loop circuit comprises a phase detector for comparing the phase of an input signal and a clock signal to generate an error signal representative of the magnitude of the phase difference. This error signal, after being filtered in a low pass filter, is applied to a controllable clock oscillator, thereby modifying the frequency of the clock signal to minimize the phase difference. In one typical prior art system, a data signal is applied to a differentiating circuit followed by a rectifier and a monostable multivibrator, to produce a pulse for each transition of the data signal. The pulse signal is used to increment or decrement a counter which, in turn, is used to control a divider circuit connected to a pulse generator for modifying the output signal of the pulse generator. However, when several circuits are connected essentially in a serial string, as in the prior art, a significant delay may be introduced in the chain. At high data frequencies, a significant phase difference between clock and data signals may occur before the clock signal can be modified.

SUMMARY OF THE INVENTION

A clock pulse generating circuit in accordance with this invention contains a minimal number of elements and provides very fast response to a phase difference between clock and data, particularly at high frequencies. The circuit comprises a voltage controlled oscillator and a clocked bistable circuit directly connected to the control terminal of the oscillator. The bistable device is triggered by the leading edge of a data pulse to control the oscillator such that either the leading edge or the trailing edge of the clock pulse tends to coincide with the leading edge of the data pulse. The bistable circuit applies a first control voltage to the oscillator when the leading edge of a data pulse is preceded by a selected edge, either leading or trailing edge, of a corresponding clock pulse, and applies a second control voltage to the oscillator when the leading edge of a data pulse precedes the selected edge of the corresponding clock pulse. The oscillator has a narrow frequency range and is responsive to the first control voltage to produce an output signal of a frequency which is equal to a fixed value minus a prescribed amount and is responsive to the second control voltage to produce an output signal of a frequency equal to the fixed value plus a prescribed amount. In this manner, the circuit provides the necessary accuracy to generate a clock pulse substantially in phase with the data, for use in processing the data. The oscillator will generate the clock pulse even though data pulses may be temporarily absent. By using only the leading edge of the data pulse, any error which might result from pulse length modification which normally occurs in data transmission, is avoided. Advantageously, the circuit is particularly adapted for very high data rates since the circuit comprises a minimum number of components and is not affected significantly by circuit delays generally encountered in more complex circuitry.

In one illustrative embodiment of the invention, a D type flip-flop having the clock signal as its D or data input and the data signal as its clock input is connected directly to a voltage controlled crystal oscillator, having a narrow frequency range. The high logic level output voltage of the flip-flop causes the oscillator to operate at a high frequency and the low level output voltage causes the oscillator to operate at a low frequency.

Advantageously, the circuit arrangement in accordance with this invention provides an inexpensive and uncomplicated circuit arrangement which uses incoming data signals to derive a clock pulse of sufficient accuracy for processing the data.

BRIEF DESCRIPTION OF THE DRAWING

The invention may be better understood from the following detailed description when read with reference to the drawing in which:

FIG. 3 is a timing diagram depicting graphically certain of the operations of the circuit of FIG. 1.

DETAILED DESCRIPTION

Figure 1:
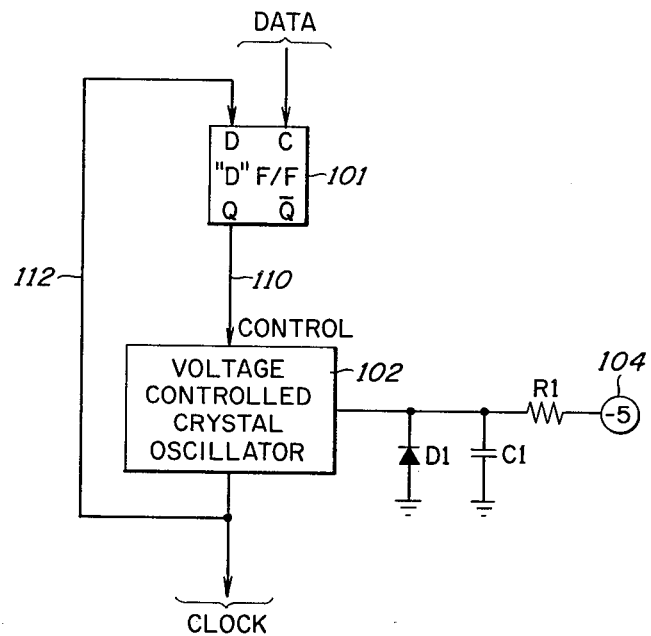
FIG. 1 represents an illustrative embodiment of a phase-locked loop circuit in accordance with the invention.

One illustrative embodiment of a circuit in accordance with this invention, comprising a "D" type flip-flop 101 and a crystal oscillator 102, is shown in FIG. 1. The flip-flop has input terminals C and D and an output terminal Q. The D type flip-flop is a well-known device and is commercially available. Functionally, the Q output terminal of the flip-flop will assume the state corresponding to the logic level of the signal applied to the D input terminal immediately after the occurrence of the leading edge of a pulse occurring on the C input terminal. As shown in FIG. 1, the D input terminal of flip-flop 101 is connected to the CLOCK output terminal of oscillator 102 via conductor 112. The C input terminal is connected to a source of data pulses via a conductor labeled DATA in the drawing. The Q output terminal of the flip-flop is directly connected to the CONTROL input terminal of oscillator 102.

Typically, the output of the voltage controlled oscillator will be a repetitive square wave. The clock signal will have a high logic level of some prescribed voltage, e.g., greater than 2 volts and a low logic level nearer 0 volts. Data pulses having similar logic levels are applied to the C input terminal of flip-flop 101. Depending upon the high or low logic levels of the signal supplied to the C and D terminals, the Q output terminal of flip-flop 101 will assume a high level, typical on the order of 3 to 4 volts, or a low level, on the order of 0 to 0.5 volts.

Figure 2:
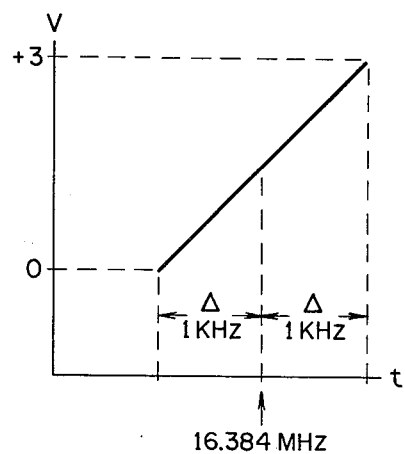
FIG. 2 depicts the frequency response of the voltage controlled oscillator included in the circuit of FIG. 1.

The voltage controlled oscillator has a frequency response as generally characterized by the plot of FIG. 2. In one operating arrangement, the oscillator is a crystal oscillator which has a base frequency of 16.384 megahertz. The oscillator is adjusted such that the application of approximately 3 volts will cause the oscillator to produce a signal at a frequency which is equal to the base frequency plus approximately 1,000 hertz and the application of approximately 0 volts causes the oscillator to produce a signal at a frequency equal to the base frequency minus approximately 1,000 hertz. Oscillators of this type having a narrow frequency band such as approximately 16 megahertz ±1,000 hertz in response to voltage swings as indicated in this example are well known and commercially available. The incremental frequency may be greater or less than 1,000 hertz. Values of 500 hertz or greater than 10,000 hertz have also been found to be satisfactory. However, as the incremental value is increased, more jitter is introduced. It has also been found that the two incremental values, above and below the fixed frequency, need not be identical. The clock oscillator 102 is connected to a negative source such as the source 104 to bias the oscillator to operate properly with the logic level signals applies to the CONTROL terminal. The source may, for example, be −5 volts connected to the oscillator through an RC network comprising a resistor R1 and capacitor C1 and a diode D1 to provide the desired voltage level.

The operation of the circuit of FIG. 1 may be better understood with reference to the timing diagram of FIG. 3. Adjacent to the designation DATA in FIG. 3, a graphical representation is shown of a synchronous stream of data pulses which occur aperiodically. That is, one or more pulses may be missing from a sequence of pulses but when a pulse occurs, it will occur at a predictable point in time. Also shown in FIG. 3, adjacent to the designation CLOCK is a string of clock pulses as generated by the voltage controlled oscillator 102. Further depicted in FIG. 3, by means of dotted lines, is relative movement of the trailing edge of the clock pulses with respect to the leading edge of the data pulses. The line adjacent to the designation "Q" OUTPUT represents the output signal of the flip-flop 101. The state transitions of this flip-flop depend upon the relative position of the trailing edge of a clock pulse and the leading edge of a corresponding data pulse. In effect, the circuit described herein aligns the trailing edge of a clock pulse with the leading edge of a corresponding data pulse. Other circuits may be devised, using the principles of this invention, whereby the leading edge of clock pulse is aligned with the data pulses. For example, if the circuit were arranged to have the $\overline{Q}$ instead of the Q output terminal of flip-flop 101 connected to the CONTROL terminal of oscillator 102, the leading edge of the clock pulse would be aligned with the leading edge of the data.

As mentioned earlier herein, the data pulses are applied to the C input terminal of flip-flop 101 and clock pulses are applied to the D input terminal of the flip-flop. Consequently, since this is a D type flip-flop, the Q output terminal of the flip-flop will assume the state of the clock pulse at the time of transition of the data pulse from a low logic level to a high logic level, i.e., at its leading edge. For example, at the time of occurrence of the leading edge of the data pulse 301, the Q output terminal of the flip-flop will assume the state of the clock pulse 302, which is the high logic state. This is shown in FIG. 3. The leading edge of the Q output is not specifically shown in a drawing since the state of the flip-flop prior to the point in time t1 shown on the timing diagram, is indeterminate. The condition indicated in FIG. 3 wherein the trailing edge of pulse 302 occurs after the leading edge of pulse 301 represents a substantial shift from the desired coincidence of these two pulse edges. As a consequence, the Q output terminal of flip-flop 101 assumes a high logic level causing a voltage of approximately +3 volts to be applied to the control terminal of oscillator 102. As suggested by the graph of FIG. 2, the application of the positive voltage will cause an increase in frequency which in effect causes the pulses of the clock signal to become shorter and tends to reduce the phase difference between clock and data pulses. This shift in phase is depicted in FIG. 3 in the relative position of the leading edge of data pulse 303 and the trailing edge of clock pulse 304. At the time indicated by t2 in FIG. 3, the relative position of the data in the clock pulses is such that the flip-flop 101 will tend to be set when it is already in the set state. Consequently, no change of state takes place.

A comparison of the leading edge of the data pulse 305 and the trailing edge of the clock pulse 306 indicates that the latter occurs before the former and, consequently, at time t3 the flip-flop 101 will change to the reset state. This causes the low logic level voltage to be applied to the control terminal 102 and, in effect, causes a low voltage to be applied to the crystal oscillator. As suggested by the frequency graph of FIG. 2, the crystal oscillator will produce the lower frequency signal, causing the clock pulses to be stretched slightly. Consequently, at time t4, the trailing edge of clock pulse 308 may occur slightly after the occurrence of a leading edge of data pulse 307, causing the flip-flop to change state again, and causing the oscillator to produce the higher frequency signal. As is suggested by the pulses shown in FIG. 3, the flip-flop may again be reset at time t5. Between times t5 and t6 shown in FIG. 3, it is assumed that a data pulse has been skipped. Since the clock oscillator is in its low frequency mode during that time, it may be assumed that the phase of the clock pulse relative to the data pulse may again have changed, causing the flip-flop 101 to change state once again. However, the generation of clock pulses is not impaired by the absence of a data pulse. It is apparent from the above, that by the setting and resetting of flip-flop 101 as described, the clock pulses may be controlled to be substantially in phase with incoming data pulses. The phase differences between clock and data pulses depicted in FIG. 3 are shown for illustrative purposes and are not intended to serve as a measure of phase difference. In a working circuit using a narrow band crystal oscillator, the clock jitter was found to be negligibly small, generally less than the jitter found in the data pulses.

It is to be understood that the above described arrangement is merely an illustrative application of the principles of this invention and that numerous other arrangements may be devised by those skilled in the art without departing from the spirit and scope of the invention.

What is claimed is:

1. A clock pulse generating circuit comprising a voltage controlled oscillator having a base frequency and having a control terminal and an output terminal, characterized in that said circuit further comprises clocked bistable means having first and second stable states and having an output terminal directly connected to said control terminal, a first input terminal connected to said oscillatior output terminal, and a second input terminal connectable to a data source;

said bistable means being responsive to clock pulses having leading and trailing edges occurring on said first input terminal and data pulses having leading and trailing edges occurring on said second input terminal to apply to said control terminal a first control signal when the leading edge of a data pulse is preceded in time by a predetermined edge of a corresponding clock pulse and a second control signal when the leading edge of a data pulse precedes said predetermined edge of a corresponding clock pulse;

said oscillator being responsive to said first control signal to provide a clock signal having a frequency which is less than said base frequency by a predetermined value and responsive to said second control signal to provide a clock signal having a frequency which is greater than said base frequency by a predetermined value.

2. The clock pulse generating circit in accordance with claim 1 characterized in that said bistable circuit means comprises a D type flip-flop.

3. The clock pulse generating circuit in accordance with claim 1 characterized in that said predetermined edge is the trailing edge of a clock pulse.

4. A clock pulse generating circuit in accordance with claim 1 characterized in that said voltage controlled oscillator comprises a crystal oscillator responsive to control signals to produce clock signals of a frequency within a narrow range from said base frequency.

5. The clock pulse generating circuit in accordance with claim 4 wherein said crystal oscillator is responsive to control signals to provide clock signals having a frequency equal to its base frequency plus or minus approximately 1,000 hertz.

* * * * *